United States Patent [19]

Versteeg et al.

[11] Patent Number: 5,451,260
[45] Date of Patent: Sep. 19, 1995

[54] METHOD AND APPARATUS FOR CVD USING LIQUID DELIVERY SYSTEM WITH AN ULTRASONIC NOZZLE

[75] Inventors: Vera A. Versteeg, Rochester; C. Thomas Avedisian; Rishi Raj, both of Ithaca, all of N.Y.

[73] Assignee: Cornell Research Foundation, Inc., Ithaca, N.Y.

[21] Appl. No.: 227,873

[22] Filed: Apr. 15, 1994

[51] Int. Cl.⁶ ............................................. C23C 16/00
[52] U.S. Cl. ..................... 118/725; 118/726; 427/248.1; 427/314
[58] Field of Search ............... 118/725, 726; 427/314, 427/248.1

[56] References Cited

U.S. PATENT DOCUMENTS

| | | | |
|---|---|---|---|
| 3,081,200 | 3/1963 | Tomkins | 427/314 |
| 4,916,089 | 4/1990 | Van Suchtelen et al. | 437/81 |
| 5,002,928 | 3/1991 | Fukui | 427/314 |
| 5,021,399 | 6/1991 | Hsu | 427/314 |
| 5,138,520 | 8/1992 | McMillan et al. | 361/311 |
| 5,164,040 | 11/1992 | Eres et al. | 118/730 |
| 5,278,138 | 1/1994 | Ott | 427/314 |

FOREIGN PATENT DOCUMENTS 548926  6/1993  European Pat. Off. .

OTHER PUBLICATIONS

Pulker, Coatings on Glass, Elsevier, Amsterdam, 1984, pp. 120–124.
Blandenet, Thin Solid Films, 77(1981) 81–90.
DeSisto, W. J. et al., "Preparation and characterization of MgO thin films deposited by spray pyrolysis of Md(2,4-pentanedionate)₂", Journal of Crystal Growth 109, pp. 314–317, 1991.
Lee, C. H. et al., "Preparation of ferroelectric BaTiO₃ thin films by metal organic chemical vapour deposition", Journal of Materials Science: Materials in Electronics 1, pp. 219–224, 1990.
McMillan, L. D. et al., Integrated Ferroelectrics, vol. 2, pp. 351–359, 1992.

Primary Examiner—Richard Bueker
Attorney, Agent, or Firm—Jones, Tullar & Cooper

[57] ABSTRACT

A liquid delivery system for a chemical vapor deposition apparatus, and a method of using the same employs one or more ultrasonic atomizing nozzles to inject one or more liquid precursor solutions directly into a CVD reactor chamber. The liquid delivery system can be operated either in a continuous mode or in a pulsed mode. In the pulsed mode, measured pulses of the liquid precursor solution are injected by the one or more ultrasonic atomizing nozzles so that control of film deposition rates as fine as monolayers per pulse can be obtained. Use of the ultrasonic nozzles insures that the liquid will be vaporized in the reactor chamber so that uniform deposition of films on one or more substrates in the reactor chamber is achieved.

10 Claims, 2 Drawing Sheets

METHOD AND APPARATUS FOR CVD USING LIQUID DELIVERY SYSTEM WITH AN ULTRASONIC NOZZLE

BACKGROUND OF THE INVENTION

The present invention relates to a method and apparatus for chemical vapor deposition (CVD) of thin films on a semiconductor substrate which uses an ultrasonic nozzle based liquid delivery system for liquid precursor solution injection.

MOCVD (metalorganic chemical vapor deposition) techniques have come into increasing use in recent years for depositing thin films, due to the growing versatility and availability of precursors and improved environmental advantages over the halogenated compounds used for conventional CVD. Most commonly, the films are deposited by dissolving the metalorganic reactant, typically a metal alkoxide, in a carrier gas, which is carried through heated lines to a heated substrate. The metal alkoxides decompose by pyrolysis, leaving the metal oxide. While this method has been used to produce excellent epitaxial films, it has the disadvantages of complexity: the precursor must be heated to fix its vapor pressure, the gas flow rate must be carefully controlled and the carrier lines must be heated to prevent condensation before reaching the reactor. Additionally, this conventional method cannot be used with certain low-volatility precursors that decompose upon heating.

Various techniques have been used to overcome some of these difficulties. Titanium dioxide films have been grown by a direct liquid injection method in which the precursor, in dilute solution, is introduced into a heated antechamber, where it evaporates and diffuses to the heated substrate below. However, this process is difficult to control, both in terms of injection and evaporation rates.

Other examples of liquid or solution precursor CVD are based on spray pyrolysis techniques and are not limited to metalorganic precursors. In some cases, a nebulizer is substituted for the gas bubbler and the carrier gas brings a fine mist to the reaction chamber where it evaporates. In other cases, a spray solution is injected directly into the reaction chamber, generally at atmospheric pressure.

Another type of liquid source CVD method is disclosed in an article by L. D. McMillan et al. entitled "Liquid Source CVD", Integrated Ferroelectrics, 1992, Vol. 2, pp. 351–359. This method employs an ultrasonic cavity to mix a liquid source with a gas stream and create a fine mist for direct injection into a vacuum chamber. As discussed in the article, this method could not, however, achieve uniform film depositions onto substrates after the liquid source mist has been introduced into the vacuum chamber unless a barrier plate was placed in close proximity to the substrate surface, the substrate was rotated and the mist was injected through a specially designed circular manifold such that the mist became confined to a small region of vacuum directly over the substrate.

In view of the foregoing, a need exists for an improved liquid source CVD technique that can achieve uniform film depositions on all sizes of substrates without the need for expensive or complex structural arrangements.

SUMMARY OF THE INVENTION

The present invention seeks to overcome the drawbacks of prior CVD techniques by providing a liquid delivery system for a CVD apparatus in which liquid precursor solution is injected directly with one or more ultrasonic atomizing nozzles into a CVD reactor chamber. Use of an ultrasonic atomizing nozzle helps insure that the liquid solution is broken up into a fine mist of very small droplets. Once these droplets are in the reactor chamber containing the substrates to be coated, they evaporate rapidly so that only vapor comes in contact with the substrate or substrates.

The liquid precursor solution, which can be formed from any organic precursor, is injected through the ultrasonic nozzle either continuously or in discrete measured pulses. In the pulsed mode of operation, a pair of sequentially operated computer controlled solenoid valves can be used which admit a measured amount of liquid precursor solution to a storage line, and then inject the measured pulse into an inlet end of the ultrasonic atomizing nozzle. To allow formation of films of complex, multicomponent compositions made from multiple precursors, a plurality of the ultrasonic nozzles and associated liquid delivery components can be disposed in the reactor chamber, one for each of the precursors.

BRIEF DESCRIPTION OF THE DRAWINGS

The foregoing and additional advantages and features of the present invention will become apparent from the following detailed description of a preferred embodiment thereof, taken in conjunction with the accompanying drawings, in which.

DETAILED DESCRIPTION OF THE PREFERRED EMBODIMENTS

Figure 1:
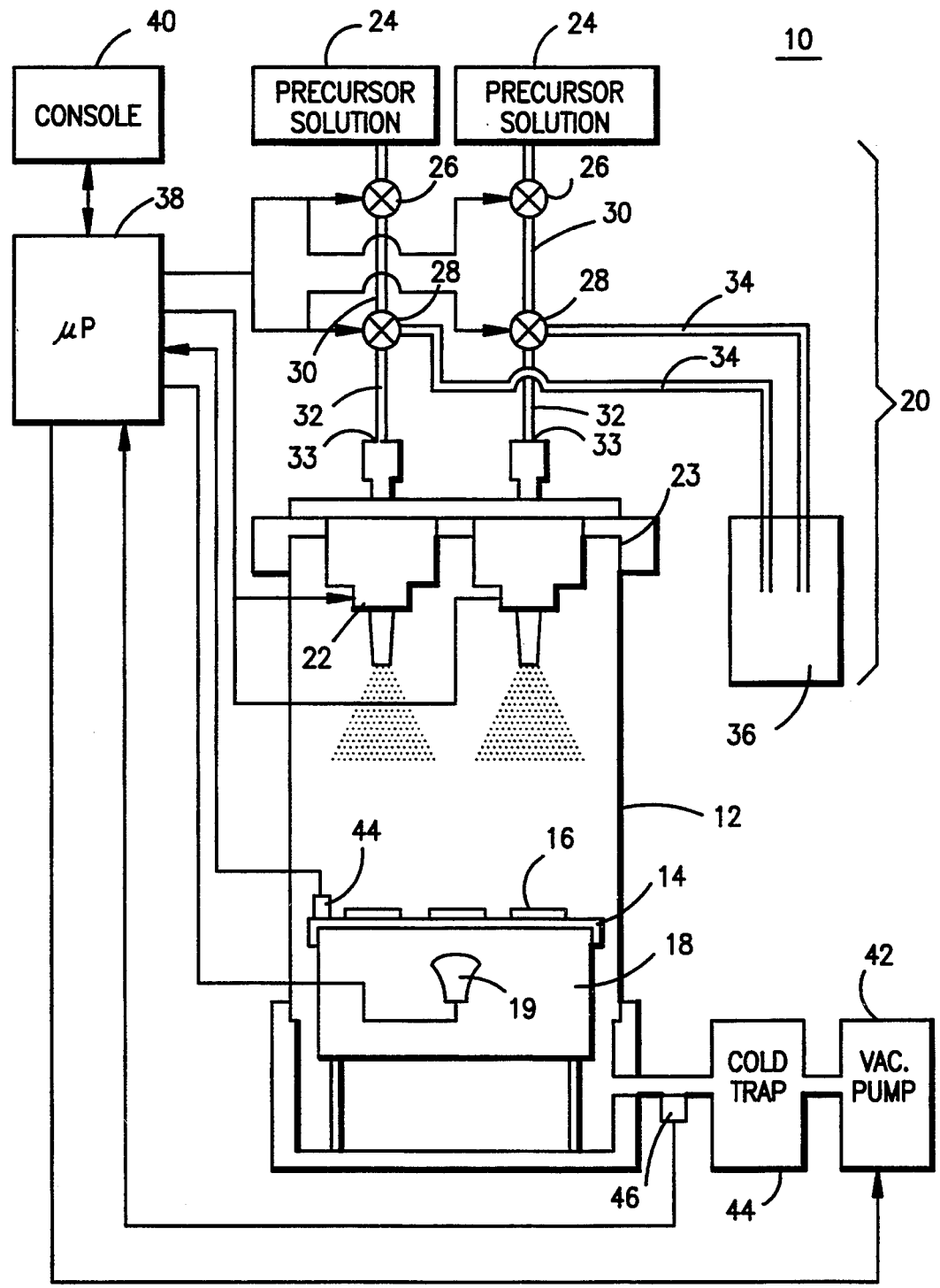
FIG. 1 is a schematic diagram of a CVD system constructed in accordance with a preferred embodiment of the present invention; and, FIG. 2 is a graph illustrating the influence of an ultrasonic nozzle on the reproducibility of pulsed injection and vaporization in the preferred embodiment.

Turning now to a detailed consideration of a first preferred embodiment of the present invention, FIG. 1 illustrates an CVD system 10 which includes a reactor chamber 12, which can be any type of conventional hot wall or cold wall CVD reactor chamber, and is preferably made of stainless steel or a quartz tube. Contained within the reactor chamber 12 is a susceptor 14 which supports one or more substrates 16 to be coated, and is mounted on a susceptor heater 18, both of these elements also being of conventional construction. Any number of the substrates 16 can be coated in sizes up to 8 inches in diameter. The heater 18 preferably consists of an infrared lamp 19 surrounded by layers of metal heat shielding (not shown) and is capable of heating the susceptor 14 to any desired temperature. A typical range of operating temperatures is from room temperature up to 1200° C. The susceptor 14 is preferably made of stainless steel and the substrates 16 are clamped thereto so that they will be heated by conduction. Other conventional components which can be employed with the system 10 but are not illustrated in FIG. 1 include a load lock for inserting and removing the substrate 16 from the reactor chamber 12 and a plasma enhancement system for creating a plasma in the reactor chamber 12, either by microwaves or by electron cyclotron resonance, which helps decompose the precursors into their solid and vapor constituents.

A key feature of the present invention is a liquid delivery system generally indicated at 20 which is employed to inject liquid precursor solution directly into the reactor chamber 12. In the embodiment illustrated in FIG. 1, the liquid delivery system 20 specifically includes first and second piezoelectrically operated ultrasonic atomizing nozzles 22 that are affixed to a top end 23 of the reactor chamber 12 so that their nozzle tips direct vaporized liquid precursor solution from a corresponding source 24 of precursor solution into the reactor chamber 12 toward the substrates 16 to be coated. It should be understood that any desired number (e.g., from 1 to 6) of the ultrasonic nozzles 22 can be provided in the reactor chamber 12, one for each precursor to be injected, and two nozzles are shown in FIG. 1 for illustrative purposes only. The use of multiple nozzles permits the formation of films of complex, multicomponent compositions made from multiple precursors. One of the nozzles can also be employed to supply an inert or reactive gas to the reactor chamber 12 if desired.

Each precursor solution can be formed from any organic or metalorganic precursor whether in liquid or in solid form. In the latter case, the solid is dissolved into a liquid to make the solution. Each ultrasonic nozzle 22 is of conventional construction, and by way of example can be of the type manufactured by SONO-TEK Corporation of Poughkeepsie, N.Y. The liquid precursor solution is metered to each ultrasonic nozzle 22 by means of first and second solenoid valves 26 and 28 and a short storage line 30 which connects the two. These three elements are employed for a pulsed injection mode of operation as discussed in greater detail below. The first valve 26 is a two-way valve which, when open, connects the corresponding source 24 of liquid precursor solution to the storage line 30 to fill the same with liquid precursor solution. The second valve 28 is a three-way valve which has one drain port connected to an input line 32 that is connected to an inlet end 33 of the ultrasonic nozzle 22, and a second drain port connected through a drain line 34 to a drain tank 36. Each drain line 34 is employed to bleed air bubbles and excess precursor solution from the corresponding storage line 30.

A conventional microprocessor 38 and associated console 40 are employed to control operation of the system 10. In particular, the microprocessor 38 controls the operation of the liquid delivery system 20, including the first and second solenoid valves 26 and 28 and each of the ultrasonic nozzles 22 (as discussed in greater detail below) so that the liquid precursor solution is injected into the chamber 12 via each ultrasonic nozzle 22, either continuously or in a plurality of discrete pulses. The microprocessor 38 also controls operation of the substrate heater 18 and a vacuum pump 42 which maintains the reactor chamber 12 at a desired sub-atmospheric pressure. Typical operating pressures range from $10^{-4}$ millibar to 1.0 bar. A cold trap 44 is connected between the vacuum pump 42 and the reactor chamber 12 for removing condensibles, including solvent vapor and reaction by-products from the exhaust. The microprocessor 38 receives inputs from a temperature sensor 44 attached to the susceptor 14 and a pressure sensor 46 in communication with a line 48 which connects the vacuum pump 42 and cold trap 44 to the reactor chamber 12, the pressure sensor being preferably a capacitance manometer. During operation, the software in the microprocessor 38 controls the temperature of the substrate, and the pressure in the reactor chamber 12. During the pulsed mode of operation, it also controls the pulse rate and the shape of the duty cycle for film growth. The pressure and temperature of the reactor chamber 12 are also continuously recorded during deposition.

During the continuous mode of operation of the system 10, both of the valves 26 and 28 are opened by the microprocessor 38 and the liquid precursor solution continuously flows to the nozzle inlet line 32 and through each ultrasonic nozzle 22 into the reactor chamber 12. The microprocessor 38 controls the power to each ultrasonic nozzle 22 as necessary so that they can evaporate precursors having different evaporation rates (e.g., volatile and non-volatile) from the precursor solution and form them into a vapor which then uniformly coats the substrates 16. In applications where the pressure within the reactor chamber 12 is maintained at a sub-atmospheric pressure by the vacuum pump 42, the pressure differential between the nozzle inlet lines 32 and the reactor chamber 12 helps inject the liquid precursor solution through the ultrasonic nozzles 22. In addition, the reduced pressure further promotes uniform film growth and enhanced vaporization of the precursor solution.

During the pulsed mode of operation of the system 10, sequential discrete pulses of liquid precursor solution are injected by each ultrasonic nozzle 22 into the reactor chamber 12. This is accomplished by the software in the microprocessor 38 which creates each pulse by first causing the first valve 26 to open for a predetermined time interval, thereby admitting a measured amount of precursor solution into the storage line 30, with the excess draining into the drain tank 36 via the second valve 28 and the drain line 34. The first valve 26 is then closed and the second valve 28 is opened, thereby communicating the liquid in the storage line 30 to the inlet end 33 of the corresponding ultrasonic nozzle 22 where it is vaporized and injected into the reactor chamber 12. Typical pulse durations are on the order of 0.1 msec. up to 5 seconds with a waiting time, $t_w$, between each pulse of between 0 and 300 seconds. Ideally, the pulse duration is chosen so that the amount of precursor injected is designed to result in one equivalent monolayer of film growth per pulse. The waiting time, $t_w$, between pulses can be optimized to obtain ordered growth, allowing sufficient time for atomic rearrangements on the substrates. Practically, $t_w$ must be larger than the time constant for the pulsed decay to achieve the pulsed effect and to avoid overloading the vacuum system. However, it should be sufficiently short to obtain useful film deposition rates.

Each mode of operation of the system 10 has its advantages. The continuous mode of operation has the advantage that it provides a much faster deposition rate, however, nozzle clogging can be a problem with this mode. The pulsed mode of operation provides considerably slower deposition rates than does the continuous mode, however, it gives much more control of the deposition rate and better reproducibility.

Figure 2:
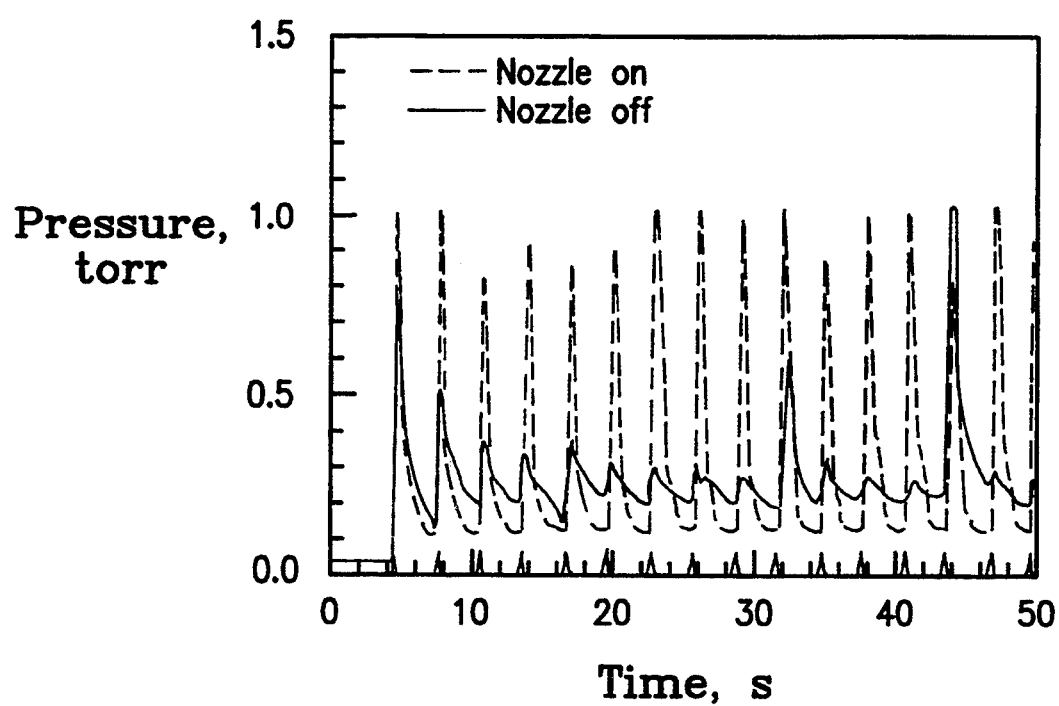

FIG. 2 specifically illustrates the experimentally observed pressure response of the reactor chamber 12 during the pulsed mode of operation which demonstrates the vaporization effect of the ultrasonic nozzle 22. The dashed lines indicate the response with the nozzle 22 operating normally. As shown, their functional form is regular and reproducible from peak to peak. In contrast, if the nozzle power is off, no atomization occurs, and the nozzle bore acts merely as a feed tube. In this case, the pressure fluctuates widely from pulse to pulse as illustrated by the solid lines. Under these conditions, large droplets were observed to coalesce and fall from the nozzle after every few pulses.

To demonstrate the results obtainable with the present invention, films of titanium dioxide were grown using the pulsed mode of operation under the following general conditions: susceptor temperature 700° C. (substrate temperature approx. 650° C.); chamber pressure 0.1–1.0 torr, as shown in FIG. 2; tw=5 or 20 s; precursor concentration 0.1% Ti(OPr$^i$)$_4$ in toluene; for 135 to 1000 pulses. All of the depositions produced transparent films with several thickness fringes. Numerous experimental techniques were employed to examine the films and these revealed that they were highly oriented, possessed a high degree of epitaxy and resulted in abrupt and dislocation-free interfaces with excellent lattice match. Further, it may be inferred from the high quality of the results that residual carbon from the precursor and the oxide film, an important issue in MOCVD, is present only in insignificant quantities.

The process variables in the pulsed, liquid injection MOCVD reactor are $N_{ML}$, the impingement rate of the metal alkoxide molecules in units of monolayers per pulse; $t_w$, the waiting time from pulse to pulse; and $T_s$, the substrate temperature. An important advantage of the present MOCVD design is that $N_{ML}$, and therefore the deposition rate can be changed by several orders of magnitude, and it is likely that the system can yield deposition rates that span a factor of $10^7$, making it useful not only for epitaxial growth but also for the growth of thick films.

Use of the ultrasonic nozzle based liquid delivery system, even in its earliest stages of development, has proven to be an extremely simple, economical means of growing highly oriented oxide films. It builds on the strength of MOCVD, the availability of safe oxide precursors, while avoiding its disadvantages: the need for cumbersome mass flow controllers, carrier gases, heated sources and lines, and a high-throughput pumping system. A compact, table-top reactor can produce uniform, oriented films, with monolayer-by-monolayer control, with no loss in quality compared to conventional MOCVD. This performance is made possible by using the ultrasonic atomizing nozzle to enhance the vaporization of the precursor solution.

The applications of the present invention are numerous. A wide variety of materials of multicomponent systems can be made using the ultrasonic nozzle based liquid delivery system. These include: ceramics, including oxides, nitrides, borides, carbides, etc.; organic materials; metals; intermetallics; and, electronic, optical and semiconductor materials.

Although the present invention has been described in terms of preferred embodiments, it will be understood that numerous modifications and variations could be made thereto without departing from the scope of the invention as set forth in the following claims.

What is claimed is:

1. A liquid delivery system for a chemical vapor deposition apparatus comprising:
    at least one ultrasonic atomizing nozzle disposed in a reactor chamber of said chemical vapor deposition apparatus for supplying vaporized liquid organic precursor solution to said reactor chamber for depositing a film on at least one substrate contained therein;
    at least one source of liquid organic precursor solution;
    a storage line for storing a measured amount of liquid precursor solution to be supplied to said ultrasonic atomizing nozzle;
    a first valve for selectively connecting said source to a first end of said storage line;
    a second valve for selectively connecting a second end of said storage line to an inlet end of said ultrasonic nozzle; and
    means for sequentially actuating said first and second valves so that a measured pulse of liquid precursor solution is admitted to said storage line through said first valve, and is then supplied to said inlet end of said ultrasonic nozzle by said second valve.

2. The liquid delivery system of claim 1, wherein said means for sequentially actuating said first and second valves comprises a microprocessor.

3. The liquid delivery system of claim 1, wherein said liquid organic precursor solution is formed from a metal organic precursor.

4. The liquid delivery system of claim 1, further comprising at least a second ultrasonic atomizing nozzle for supplying vaporized liquid organic precursor solution to said reactor chamber and a second means for supplying a liquid precursor solution to said second ultrasonic atomizing nozzle for vaporization and injection into said reactor chamber.

5. The liquid delivery system of claim 1, further comprising means for maintaining sub-atmospheric pressure in said reactor chamber.

6. A liquid delivery system for a chemical vapor deposition apparatus comprising:
    at least one ultrasonic atomizing nozzle disposed in a reactor chamber of said chemical vapor deposition apparatus for supplying vaporized liquid organic precursor solution to said reactor chamber for depositing a film on at least one substrate contained therein;
    at least one source of liquid organic precursor solution; and
    means for supplying measured, discrete pulses of said liquid precursor solution to said ultrasonic atomizing nozzle.

7. The liquid delivery system of claim 6, further including microprocessor means for controlling said means for supplying measured, discrete pulses.

8. The liquid delivery system of claim 6, wherein said liquid. organic precursor solution is formed from a metal organic precursor.

9. The liquid delivery system of claim 6, further comprising at least a second ultrasonic atomizing nozzle for supplying vaporized liquid organic precursor solution to said reactor chamber and a second means for supplying measured, discrete pulses of liquid precursor solution to said second ultrasonic atomizing nozzle for vaporization and injection into said reactor chamber.

10. The liquid delivery system of claim 6, further comprising means for maintaining sub-atmospheric pressure in said reactor chamber.

* * * * *